(12) United States Patent
Yokoyama

(10) Patent No.: US 9,842,291 B2
(45) Date of Patent: Dec. 12, 2017

(54) PROTECTIVE COVER

(71) Applicant: DENSO WAVE INCORPORATED, Chita-gun, Aichi-pref. (JP)

(72) Inventor: Hiroaki Yokoyama, Obu (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 0 days.

(21) Appl. No.: 15/173,122

(22) Filed: Jun. 3, 2016

(65) Prior Publication Data

US 2016/0374220 A1 Dec. 22, 2016

(30) Foreign Application Priority Data

Jun. 19, 2015 (JP) .................. 2015-124004

(51) Int. Cl.
| | |
|---|---|
| *H05K 7/02* | (2006.01) |
| *H05K 7/04* | (2006.01) |
| *G06K 19/077* | (2006.01) |
| *H05K 7/14* | (2006.01) |

(52) U.S. Cl.
CPC ..... *G06K 19/07749* (2013.01); *H05K 7/1481* (2013.01)

(58) Field of Classification Search
CPC .................. H05K 7/1481; G06K 19/07749
USPC ........................ 361/807, 809, 810
See application file for complete search history.

(56) References Cited

U.S. PATENT DOCUMENTS

| | | | | |
|---|---|---|---|---|
| 6,259,598 B1* | 7/2001 | Beaman | .................. | G06F 1/181 361/679.32 |
| 6,641,034 B1* | 11/2003 | Oki | ........................ | G06K 13/08 235/380 |
| 7,563,113 B2* | 7/2009 | Sheng | ................ | H01R 13/5227 439/135 |
| 7,755,906 B2* | 7/2010 | Sato | .................... | G03G 21/1652 361/730 |
| 7,804,691 B1* | 9/2010 | Davis | .................... | H05K 5/0247 361/752 |
| 2003/0016492 A1* | 1/2003 | Yanagi | .................. | G06F 1/1656 361/679.57 |
| 2005/0202709 A1* | 9/2005 | Campbell, III | .... | H01R 13/6395 439/373 |
| 2014/0080334 A1* | 3/2014 | Tetsuya | .............. | H01R 13/5213 439/136 |

FOREIGN PATENT DOCUMENTS

JP 2006-099639 A 4/2006

\* cited by examiner

*Primary Examiner* — Hung S Bui
(74) *Attorney, Agent, or Firm* — Oliff PLC

(57) ABSTRACT

A protective cover includes a peripheral wall part and a bottom part to define a receiving space to receive a protrusion part of a storage medium protruding from an external surface of a case having an insertion hole in which the storage medium is put. The peripheral wall part has an opening at an end opposite from the bottom part. The peripheral wall part has an attachment part that is put in the insertion hole. The attachment part is a portion of the peripheral wall part, and has a predetermined length from the opening toward the bottom part. An outer surface of the attachment part is in contact with an inner surface of the insertion hole such that the peripheral wall part is attached to the case. The peripheral wall part has a cutout extending from the opening toward the bottom part.

12 Claims, 7 Drawing Sheets

PROTECTIVE COVER

CROSS REFERENCE TO RELATED APPLICATION

This application is based on Japanese Patent Application No. 2015-124004 filed on Jun. 19, 2015, the disclosure of which is incorporated herein by reference in its entirety.

TECHNICAL FIELD

The present disclosure relates to a protective cover.

BACKGROUND

JP 2006-99639 A describes a control apparatus such as programmable logic controller (PLC) which controls industrial apparatus such as robot in an assembly line in a factory. A case of the control apparatus may have an insertion hole to which a storage medium shaped in a card such as SD card is put. A worker inserts a storage medium into an insertion hole so as to, for example, rewrite the control program for the industrial apparatus or perform data logging to acquire execution record of the control program.

SUMMARY

When a control apparatus is downsized, a space in a case of the control apparatus is narrow. A space for accommodating the recording media entirely may not be securable in the state where the storage medium is put in the insertion hole of the case. For example, a portion of the storage medium opposite from the insertion side may protrude from the external surface of the case of the control apparatus. In such control apparatus, a protective cover for the storage medium is needed in order to protect the storage medium put in the insertion hole.

A worker puts a storage medium in an insertion hole in a state where an assembly line is stopped. It is required to shorten the time period taken for inserting a storage medium, in order to shorten the stop time of the assembly line. However, the stop time of the assembly line is increased if it is necessary to attach the protective cover in addition to inserting the storage medium. When the assembly line has plural control apparatus, the time taken for completing the insertion of the storage medium and the attachment of the protective cover becomes longer relative to each of the plural control apparatus. In this case, the stop time of the assembly line becomes longer.

It is an object of the present disclosure to provide a protective cover for a storage medium so as to shorten time period taken for inserting a storage medium into an insertion hole of a case and for attaching the protective cover to the case.

According to an aspect of the present disclosure, a protective cover that protects a protrusion part of a storage medium protruding from an external surface of a case having an insertion hole in which the storage medium is arranged includes: a peripheral wall part; and a bottom part made of an elastic material. A receiving space is defined by the peripheral wall part and the bottom part to receive the protrusion part of the storage medium. The peripheral wall part has an opening at an end opposite from the bottom part. The opening is connected with the receiving space, and the storage medium is located in the opening. The peripheral wall part has an attachment part that is located in the insertion hole. The attachment part is a portion of the peripheral wall part and has a predetermined length from the opening toward the bottom part. An outer surface of the attachment part is in contact with an inner surface of the insertion hole such that the peripheral wall part is attached to the case. The peripheral wall part has a cutout extending from the opening toward the bottom part.

The receiving space receiving the protrusion part of the storage medium is defined by the peripheral wall part and the bottom part. The peripheral wall part has the opening at the end opposite from the bottom part, and the opening is connected with the receiving space. The protrusion part of the storage medium is first received in the receiving space by inserting the storage medium into the opening. When the bottom part of the protective cover is pushed such that the opening is directed to the insertion hole in the state where the storage medium is received in the receiving space, the attachment part is elastically deformed and is pushed into the insertion hole, and the outer surface of the attachment part is in contact with the inner surface of the insertion hole.

The cutout extending toward the bottom part from the opening is formed in the peripheral wall part. A portion of the peripheral wall part having the predetermined length from the opening toward the bottom part is the attachment part through which the protective cover is attached to the case. The cutout can be formed as a relief part adjacent to the opening of the peripheral wall part, compared with a case where the cutout is not formed. Therefore, the bottom part of the protective cover can be easily elastically deformed in the insertion direction. As a result, the insertion of the storage medium and the attachment of the protective cover can be done simultaneously by pushing the bottom part of the protective cover in the state where the storage medium is held in the receiving space. Thus, the time period taken for inserting the storage medium into the insertion hole and for attaching the protective cover can be shortened. Accordingly, the stop time of an assembly line can be shortened.

Moreover, the attachment part is elastically deformed inward by pushing the peripheral wall part inward with a worker's finger. The storage medium and the protective cover can be pressed into the insertion hole by pushing the bottom part with one finger (for example, middle finger) while the peripheral wall part is elastically deformed with two fingers (for example, the thumb and the index finger) in the state where the storage medium is held in the receiving space. Thereby, the insertion of the storage medium and the attachment of the protective cover can be done easily.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

A protective cover according to an embodiment for a storage medium is described referring to drawings. The protective cover protects the storage medium shaped in a card, such as SD card or Compact Flash (registered trademark).

Figure 5:
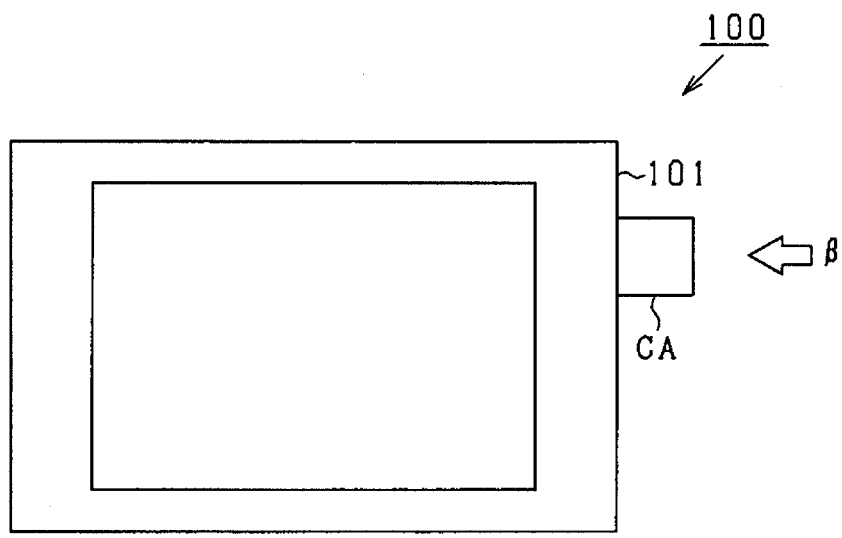
FIG. 5 is an elevation view illustrating a control apparatus to which a storage medium is inserted.

As shown in FIG. 5, a storage medium CA is inserted into an insertion hole defined on a side of a control apparatus 100 such as programmable logic controller (PLC) which controls industrial apparatus such as robot or conveyor in an assembly line in a factory. Thereby, a control program is rewritten for a robot, or a data logging of a control program is performed. The storage medium CA is inserted before an operation of an assembly line, and is drawn out after the operation of the assembly line, such that a data logging is performed.

Figure 6:
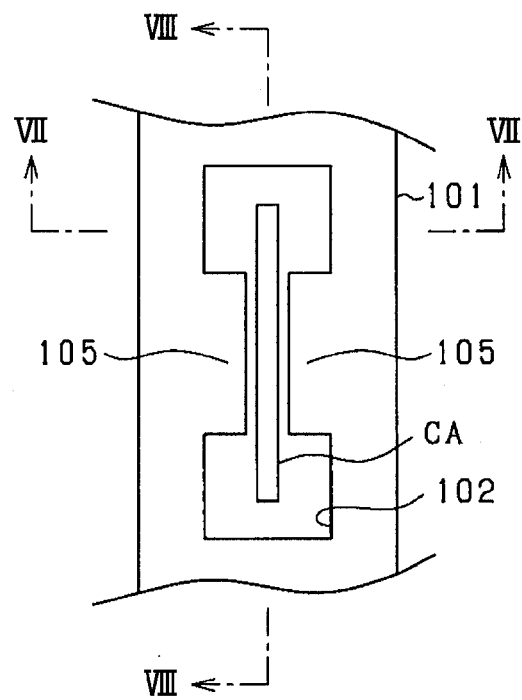
FIG. 6 is an enlarged view of the control apparatus of FIG. 5 seen in a direction β.

As shown in FIG. 6, the control apparatus 100 has a case 101 with an insertion hole 102 defined on a side of the case 101. The other side of the storage medium CA opposite from the insertion side protrudes from the external surface of the case 101 when the storage medium CA is inserted. The protective cover protects the protrusion part of the storage medium CA.

The configuration of the protective cover is explained.

As shown in FIG. 1-FIG. 4, the protective cover 10 has a peripheral wall part 11, a flange part 12, an attachment part 13, and an engaging part 14. In this embodiment, the protective cover 10 is made of an elastic material such as rubber.

Figure 1:
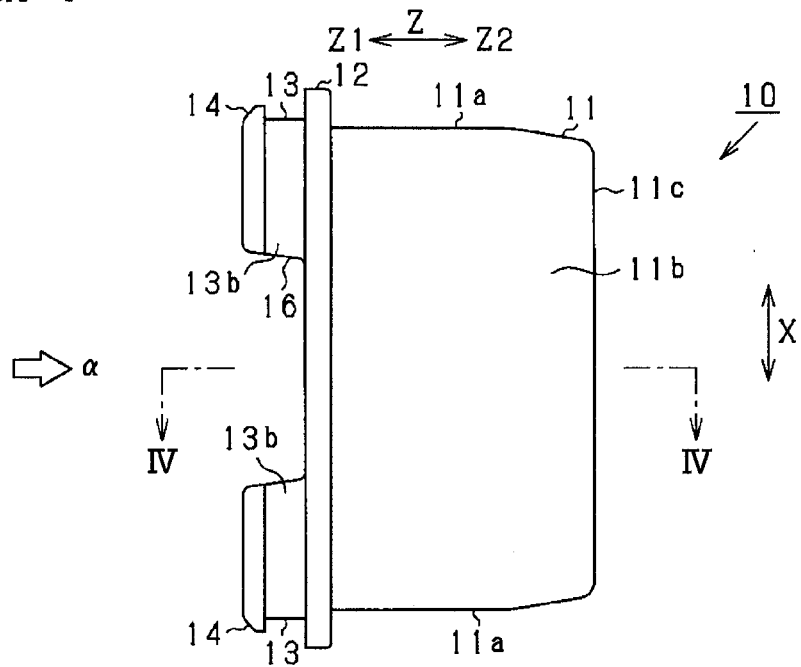
FIG. 1 is a plan view illustrating a protective cover according to an embodiment.
Figure 2:
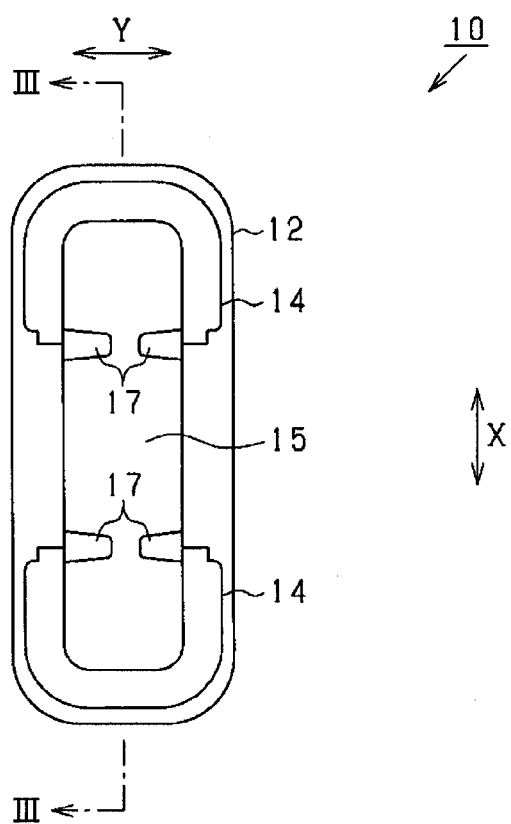
FIG. 2 is a side view illustrating the protective cover of FIG. 1 seen in a direction α.
Figure 3:
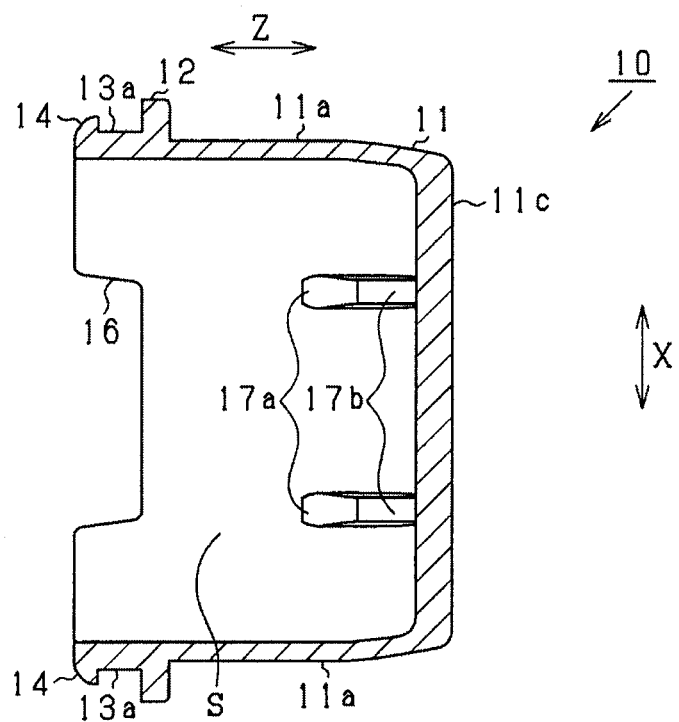
FIG. 3 is a cross-sectional view taken along a line III-III of FIG. 2.
Figure 4:
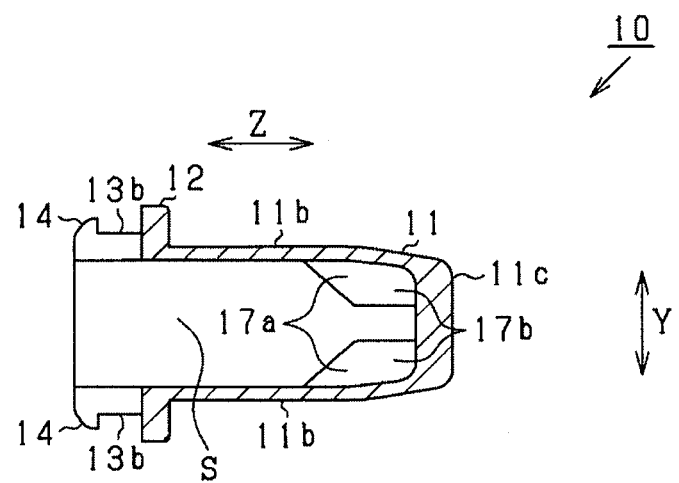
FIG. 4 is a cross-sectional view taken along a line IV-IV of FIG. 1.

The peripheral wall part 11 has a flat rectangular parallelepiped shape with one opening 15. The peripheral wall part 11 has a pair of first wall parts 11a opposing to each other in a longitudinal direction of the opening 15 (X direction), and a pair of second wall parts 11b opposing to each other in a short-side direction of the opening 15 (Y direction). The opening 15 is formed in one end of the peripheral wall part 11. The other end of the peripheral wall part 11 opposite from the opening 15 is closed by a bottom part 11c. A receiving space S connected with the opening 15 is formed of the first wall parts 11a, the second wall parts 11b, and the bottom part 11c. In FIG. 1, the depth direction of the peripheral wall part 11 from the opening 15 to the bottom part 11c is defined as Z direction, in which the insertion side adjacent to the opening 15 is defined as Z1, and the opposite side adjacent to the bottom part 11c is defined as Z2.

The flange part 12 is projected outward from the peripheral wall part 11. A surface of the flange part 12 adjacent to the opening 15 is in contact with the external surface of the case 101 in the state where the protective cover 10 is attached to the case 101. In this embodiment, the flange part 12 is formed over all the circumferences of the peripheral wall part 11.

Each of the second wall parts 11b has a cutout 16 extending in a direction from the opening 15 toward the bottom part 11c. In this embodiment, the cutout 16 extends from the opening 15 to in front of the flange part 12. The cutout 16 has a predetermined width on the basis of the center of the opening 15 in the longitudinal direction.

The attachment part 13 is a portion of the peripheral wall part 11 having a predetermined length from the opening 15 toward the bottom part 11c. In this embodiment, the attachment part 13 is a portion of the peripheral wall part 11 located between the engaging part 14 and the flange part 12. The attachment part 13 is defined on both sides of the cutout 16. In this embodiment, the opening 15 means an opening which exists on a plane including the tip end of the attachment part 13.

Figure 9:
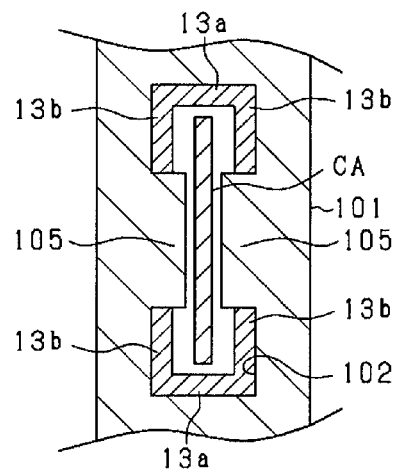
FIG. 9 is a cross-sectional view taken along a line IX-IX of FIG. 8C.

As shown in FIG. 9, each of the attachment parts 13 has a short side attachment 13a and a long side attachment 13b. The short side attachment 13a extends in the short-side direction of the opening 15. The long side attachment 13b extends in the longitudinal direction of the opening 15 from the respective ends of the short side attachment 13a in the short-side direction.

In this embodiment, an interval dimension between the second wall parts 11b in the short-side direction of the opening 15 is larger than the thickness of the storage medium CA. An interval dimension between the long side attachments 13b opposing to each other in the short-side direction is larger than the thickness of the storage medium CA.

In addition, an interval dimension between the first wall parts 11a in the longitudinal direction of the opening 15 is larger than the width size of the storage medium CA. An interval dimension between the short side attachments 13a opposing to each other in the longitudinal direction is larger than the width size of the storage medium CA.

The engaging part 14 is defined at a tip end portion of the peripheral wall part 11 adjacent to the opening 15, and is connected with the internal surface of the case 101 adjacent to the peripheral part of the insertion hole 102 in the state where the attachment part 13 is located in the insertion hole 102.

The peripheral wall part 11 further has a rib part 17. The rib part 17 includes a pair of ribs extending in a direction from the bottom part 11c toward the opening 15, inside of the peripheral wall part 11. In this embodiment, the peripheral wall part 11 has plural (two) sets of the rib part 17. Each of the rib parts 17 is located offset from the center in the longitudinal direction of the opening 15.

The rib part 17 has a guide part 17a and a holding part 17b. The height of the guide part 17a from the internal surface of the second wall part 11b is increased as the guide part 17a extends toward the bottom part 11c from the opening 15. The holding part 17b is continuously formed from the guide part 17a, and holds the end of the storage medium CA. The guide part 17a smoothly guides the storage medium CA, which is inserted from the opening 15, to the holding part 17b.

Figure 7:
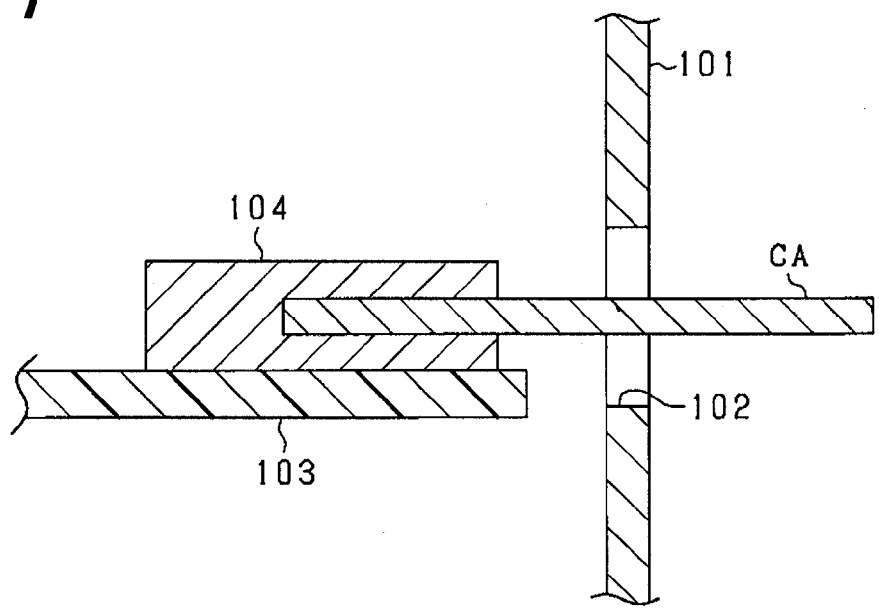
FIG. 7 is a cross-sectional view taken along a line VII-VII of FIG. 6.

The control apparatus 100 to which the protective cover 10 is attached is explained with reference to FIG. 5-FIG. 7. The protective cover 10 is not attached to the control apparatus 100 in FIG. 5-FIG. 7.

The control apparatus 100 includes a control board 103 and a connector 104 inside of the case 101. The connector 104 is mounted on the surface of the control board 103 in the state where a side of the connector 104 to which the storage medium CA is inserted opposes the insertion hole 102. The control board 103 and the storage medium CA are electrically connected with each other by inserting the storage medium CA into the connector 104. Thereby, the rewriting or data logging of a control program can be performed.

As shown in FIG. 6, in this embodiment, the case 101 has a pair of projection parts 105 extending in the thickness direction of the storage medium CA from a peripheral part of the insertion hole 102 of the case 101 at a middle (specifically center) in the width direction of the storage medium CA. Each of the projection parts 105 prevents the storage medium CA from accidentally entering a clearance (refer to FIG. 7) between the case 101 and the connector 104, when inserting the storage medium CA into the connector 104.

Figure 8A:
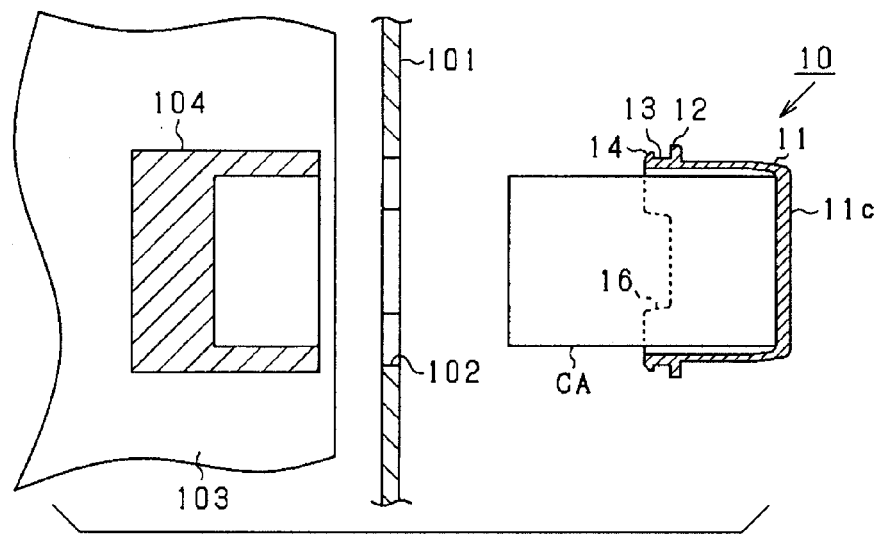
FIGS. 8A, 8B and 8C are views illustrating a method of attaching the protective cover to the control apparatus.
Figure 8B:
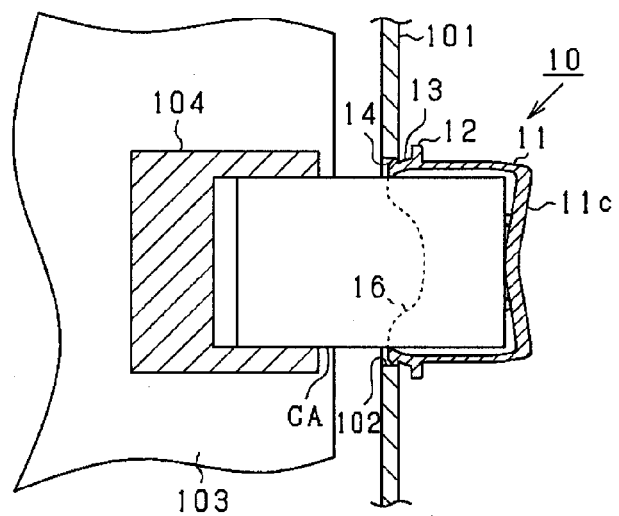
Figure 8C:
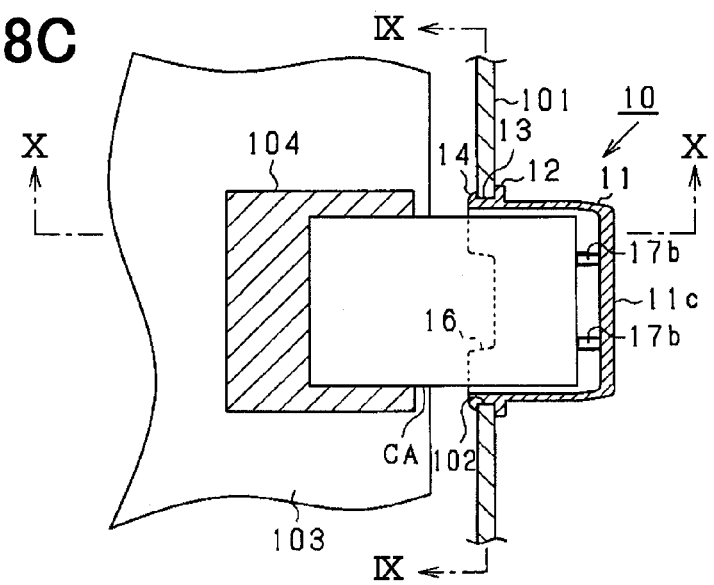

A method of attaching the protective cover 10 to the case 101 is explained with reference to FIG. 8A-FIG. 10. FIGS. 8A, 8B and 8C correspond to cross-sectional views taken along a line VIII-VIII of FIG. 6. The hatching of the storage medium CA is omitted in FIGS. 8A, 8B and 8C.

As shown in FIG. 8A, before attaching the protective cover 10 to the case 101, the storage medium CA is put into the opening 15 of the peripheral wall part 11. Thereby, the protrusion part of the storage medium CA is received in the receiving space S of the protective cover 10. Moreover, the end of the storage medium CA is guided to the holding part 17b by the guide part 17a. Thereby, while the end of the storage medium CA is held at the holding part 17b, the tip end portion of the storage medium CA opposite from the insertion side is in contact with the internal surface of the bottom part 11c.

Then, an operator holds the protective cover 10 and the storage medium CA in the state where the storage medium CA is received in the receiving space S. In detail, the pair of second wall parts 11b is supported by two fingers (for example, the thumb and the index finger) of the operator to hold the protective cover 10 and the storage medium CA. In this case, the storage medium CA can be easily inserted into the insertion hole 102, and the protective cover 10 can be easily attached. That is, when the second wall parts 11b are pushed inward, the attachment part 13 is elastically deformed inward. When the central portion of the bottom part 11c is pressed with a finger in an insertion direction, the attachment part 13 can easily fit with the insertion hole 102. Thus, the storage medium CA can be easily inserted into the insertion hole 102, and the protective cover 10 can be easily attached.

In a comparison example where not the second wall parts 11b but the first wall parts 11a are handled by two fingers, the attachment part 13 cannot be easily elastically deformed inward, due to the flange part 12.

Since the second wall part 11b is larger in the surface area than the first wall part 11a, the protective cover 10 and the storage medium CA can be stably held through the second wall parts 11b, compared with a case where the protective cover 10 and the storage medium CA are handled through the first wall parts 11a. Therefore, the protective cover 10 can be restricted from dropping accidentally.

As shown in FIG. 8B, the tip end portion of the storage medium CA exposed from the protective cover 10 is inserted into the insertion hole 102 and the connector 104. While the second wall parts 11b are supported with two fingers, the central portion of the bottom part 11c is pressed with one finger (for example, middle finger) in the insertion direction. Thereby, the attachment part 13 is pressed into the insertion hole 102, while the attachment part 13 and the engaging part 14 are elastically deformed inward. Furthermore, since the peripheral wall part 11 has the cutout 16, the bottom part 11c can be easily elastically deformed toward the opening 15 in the insertion direction, compared with a case where the peripheral wall part 11 does not have the cutout 16. For this reason, the storage medium CA is pushed by the bottom part 11c, and is advanced in the insertion direction.

As shown in FIG. 8C, the attachment part 13 is pressed into the insertion hole 102 until the flange part 12 contacts the external surface of the case 101. Thereby, the insertion of the storage medium CA into the connector 104 is completed, and the outer surface of the attachment part 13 contacts the inner surface of the insertion hole 102.

In detail, as shown in FIG. 9, the outer surfaces of the short side attachment 13a and the long side attachment 13b are in contact with the inner surface of the insertion hole 102. Thereby, the protective cover 10 is attached to the case 101 in the state where the protrusion part of the storage medium CA is held in the receiving space S. Moreover, the insertion hole 102 is covered with the peripheral wall part 11 and the bottom part 11c.

Figure 10:
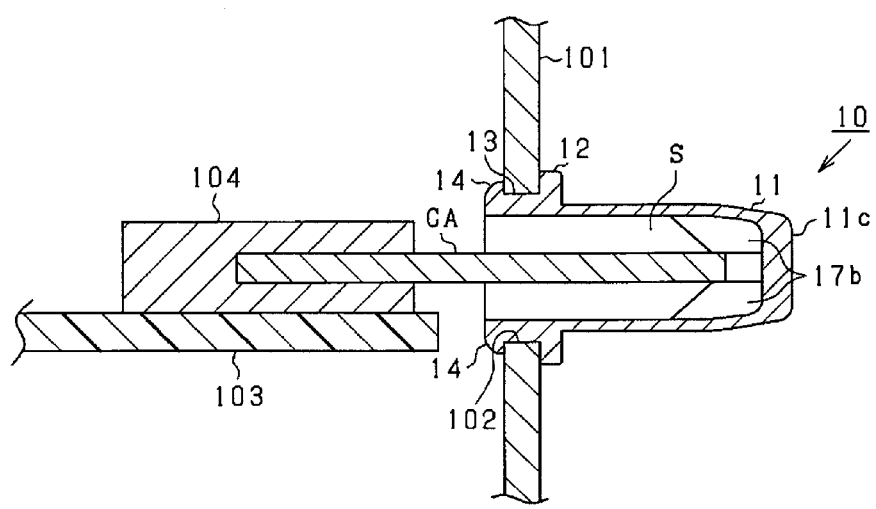
FIG. 10 is a cross-sectional view taken along a line X-X of FIG. 8C.

As shown in FIG. 10 which is a cross-sectional view taken along a line X-X of FIG. 8C, when the protective cover 10 is attached to the case 101, the storage medium CA is held by the connector 104 and the holding part 17b in the state where the surface is separated from the internal surfaces of the first wall part 11a and the second wall part 11b. Moreover, when the protective cover 10 is attached to the case 101, a clearance is defined between the storage medium CA and the bottom part 11c in the insertion direction of the storage medium CA.

Figure 11:
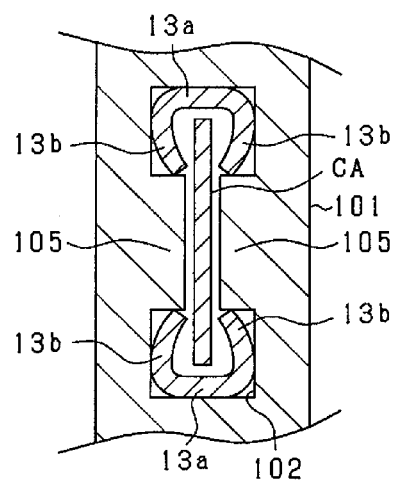
FIG. 11 is a sectional view illustrating the protective cover when removing the storage medium from the control apparatus.

A method of removing the protective cover 10 from the case 101 is explained with reference to FIG. 11. FIG. 11 is a cross-sectional view taken along the line IX-IX of FIG. 8C.

When removing the protective cover 10 from the case 101, first, the second wall parts 11b are deformed by being pressed between two fingers of the operator, to catch the storage medium CA. At this time, as shown in FIG. 11, the long side attachment 13b is elastically deformed, and a part of the outer surface is separated from the inner surface of the insertion hole 102. Then, the protective cover 10 is drawn out in the insertion direction of the storage medium CA in the state where the storage medium CA is supported through the second wall parts 11b. Thereby, while the protective cover 10 is removed from the case 101, the storage medium CA is drawn out from the insertion hole 102.

Advantages of this embodiment are explained.

According to the embodiment, a portion of the peripheral wall part 11 extending from the flange part 12 toward the opening 15 is defined as the attachment part 13, and the cutout 16 is defined in the peripheral wall part 11 to extend in the direction from the opening 15 toward the bottom part 11c. The cutout 16 corresponds to a relief part formed at a position adjacent to the opening 15 of the peripheral wall part 11 when attaching the protective cover 10 to the case 101, compared with a case where the peripheral wall part 11 does not have the cutout 16. Therefore, the bottom part 11c can be easily elastically deformed in the insertion direction. As a result, simultaneously the storage medium CA can be inserted in the insertion hole 102, and the protective cover 10 can be attached to the case 101 by fitting the attachment part 13 to the insertion hole 102 in the state where the storage medium CA is held in the receiving space S. The time period taken for inserting the storage medium CA and for attaching the protective cover 10 can be shortened, compared with a case where the protective cover 10 is attached to the case 101 after the storage medium CA is inserted into the insertion hole 102 in the state where the storage medium CA is not held in the receiving space S. Therefore, the stop time of an assembly line can be shortened.

Moreover, in this embodiment, the cutout 16 makes each of the attachment parts 13 to be easily elastically deformed inward, when fitting the attachment part 13 into the insertion hole 102, compared with a case where the cutout 16 is not formed. When fitting the attachment part 13 into the insertion hole 102, the attachment part 13 can be easily elastically deformed, and a force required for fitting the attachment part 13 into the insertion hole 102 can be made smaller. As a result, the burden of the operator who attaches the protective cover 10 can be reduced.

Furthermore, in this embodiment, when the central portions of the second wall parts 11b are pressed inward, the attachment part 13 is elastically deformed inward. For this reason, the storage medium CA and the protective cover 10 can be pressed into the insertion hole 102 by pushing the bottom part 11c by the middle finger while the second wall parts 11b are elastically deformed by the thumb and the index finger in the state where the storage medium CA is held in the receiving space S. Thereby, the storage medium CA can be easily inserted in the insertion hole 102, and the protective cover is easily attached.

According to the embodiment, the cutout 16 is formed in each of the second wall parts 11b opposing to each other, as a relief part formed in each of the second wall parts 11b. When attaching the protective cover 10 to the case 101, the bottom part 11c can be easily elastically deformed in the insertion direction. Thereby, the storage medium CA can be easily inserted in the insertion hole 102, and the protective cover is easily attached.

Moreover, the cutout 16 is formed at a position where the second wall parts 11b oppose to each other. Therefore, the second wall parts 11b are elastically deformed similarly when pushing the bottom part 11c. For this reason, the attachment part 13 of one of the second wall parts 11b is elastically deformed inward similarly as the attachment part 13 of the other of the second wall parts 11b. Thus, the attachment part 13 can be easily inserted in the insertion hole 102. Moreover, since the second wall parts 11b have similar elastic deformation, operation required to the finger placed on one of the second wall parts 11b and operation required to the finger placed on the other of the second wall parts 11b can be made the same. Accordingly, mistake can be reduced in the operation inserting the storage medium CA and the operation attaching the protective cover 10.

According to the embodiment, the peripheral wall part 11 has the flange part 12. An operator can simply know that the protective cover 10 is attached to the case 101 by checking that the flange part 12 is in contact with the external surface of the case 101. Thereby, the insertion of the storage medium CA and the attachment of the protective cover 10 can be performed efficiently.

According to the embodiment, the cutout 16 is defined in the peripheral wall part 11 to extend from the opening 15 to the flange part 12. For this reason, the connector 104 inside of the case 101 can be restricted from connecting with the outside of the case 101 through the insertion hole 102 in the state where the protective cover 10 is attached to the case 101. Therefore, the length of the cutout 16 can be maximized, and the insertion operation of the storage medium CA and the attachment operation of the protective cover 10 can be performed efficiently. Furthermore, an explosion-proof standard of the control apparatus 100 can be fulfilled.

According to the embodiment, the peripheral wall part 11 has the rib part 17. The storage medium CA can be prevented from dropping out of the protective cover 10 when attaching the protective cover 10 to the case 101. Thereby, the insertion of the storage medium CA and the attachment of the protective cover 10 can be performed efficiently.

According to the embodiment, the rib part 17 is formed at the position separated from the center in the longitudinal direction of the opening 15. When attaching the protective cover 10 to the case 101, the central portion of the bottom part 11c is pushed. In a comparison example, if a rib part is located at the center in the longitudinal direction of the opening 15, the central portion of the bottom part 11c becomes difficult to have elastic deformation in the insertion direction.

In contrast, according to the embodiment, the elastic deformation of the bottom part 11c in the insertion direction is not affected by the rib part 17 at the position offset from the center in the longitudinal direction of the opening 15, when attaching the protective cover 10 to the case 101. Thus, the storage medium CA can be smoothly inserted in the insertion hole 102. Further, the insertion of the storage medium CA and the attachment of the protective cover 10 can be performed easily.

Moreover, when the storage medium CA is supported through the second wall parts 11b in order to remove the protective cover 10, the elastic deformation of the second wall part 11b is not affected by the rib part 17. As a result, the elastic deformation of the long side attachment 13b connected with the second wall part 11b is not affected by the rib part 17. Thereby, the protective cover 10 can be easily removed.

According to the embodiment, the peripheral wall part 11 has the engaging part 14. Therefore, the protective cover 10 can be restricted from dropping, if external force such as vibration is added to the protective cover 10.

According to the embodiment, the protective cover may include the flange part projected outward from the peripheral wall part. The flange part is in contact with the external surface of the case in a state where the peripheral wall part is attached to the case. The attachment part of the peripheral wall part is defined between the opening and the flange part.

The protective cover is attached to the case by fitting the attachment part into the insertion hole until the flange part contacts the external surface of the case. An operator can easily know that the protective cover is attached to the case by checking that the flange part is in contact with the external surface of the case.

According to the embodiment, the case includes the control board, and the connector arranged on the control board to oppose the insertion hole. The connector electrically connects the control board to the storage medium. The peripheral wall part and the bottom part, which are attached to the case, cover the insertion hole. The cutout extends from the opening toward the bottom part, and has a length shorter than or equal to the predetermined length.

The bottom part of the protective cover can be easily elastically deformed in the insertion direction by increasing the length of the cutout from the opening toward the bottom part. Thereby, the insertion of the storage medium and the attachment of the protective cover can be done easily.

In order to fulfill an explosion-proof standard of the control apparatus, the connector inside the case, at which electric sparks may be generated, is prevented from connecting outside of the case through the insertion hole in the state where the protective cover is attached to the case. If the length of the cutout is too much long, a clearance may arise between the peripheral wall part and the external surface of the case in the state where the protective cover is attached to the case.

The peripheral wall part and the bottom part are formed so that the insertion hole is covered with the bottom part and the peripheral wall part in the state where the protective cover is attached to the case. Accordingly, the explosion-proof standard can be fulfilled by preventing the connector inside the case from being connected to the outside of the case through the insertion hole.

According to the embodiment, the cutout may extend from the opening to the flange part.

Accordingly, the length of the cutout is maximized while keeping the flange part, such that the insertion of the storage medium and the attachment of the protective cover can be performed more easily under the situation where the explosion-proof standard is satisfied.

According to the embodiment, the cutout may extend from the opening to a position between the flange part and the bottom part.

In this case, a part of the flange part is removed due to the cutout. For this reason, the bottom part of the protective cover can be easily elastically deformed in the insertion direction, and the force required for pushing the protective cover can be made small. Thereby, the insertion of the storage medium and the attachment of the protective cover can be performed more easily.

According to the embodiment, the cutout is one of a plurality of cutouts defined in the peripheral wall part.

Accordingly, the cutouts can be formed as plural relief parts adjacent to the opening of the peripheral wall part, such that the bottom part of the protective cover can be easily elastically deformed in the insertion direction. Thereby, the insertion of the storage medium and the attachment of the protective cover can be performed more easily.

The plurality of cutouts may be formed at positions opposing to each other in the peripheral wall part.

According to the embodiment, a depth dimension from the opening to the bottom part is set such that a clearance is defined between the storage medium and the bottom part in an insertion direction of the storage medium in a state where the storage medium is received in the receiving space and where the flange part is in contact with the external surface of the case.

A clearance is formed between the storage medium and the bottom part in the state where the storage medium is held in the receiving space and where the flange part is in contact with the external surface of the case. For this reason, it is necessary to increase the elastic deformation of the bottom part in order to insert the storage medium in the insertion hole at a time of attaching the protective cover. Due to the cutout defined in the peripheral wall part, the elastic deformation of the bottom part can be increased.

According to the embodiment, the protective cover may further include the holding part holding an end of the storage medium to determine a position of the storage medium relative to the protective cover. The holding part is defined on an inner surface of the peripheral wall part adjacent to the bottom part.

The protrusion part of the storage medium is held in the receiving space by inserting the storage medium into the opening before the protective cover is attached to the case. Further, the end of the storage medium is held by the holding part so that the position of the storage medium is determined relative to the protective cover. For this reason, when attaching the protective cover to the case, the storage medium can be prevented from dropping out of the protective cover. Thereby, the insertion of the storage medium and the attachment of the protective cover can be performed efficiently.

The holding part has a pair of ribs extending from the bottom part toward the opening along the inner surface of the peripheral wall part, and the holding part is located at a position offset from a center in a longitudinal direction of the opening.

The end of the storage medium is supported between the pair of ribs of the holding part. The holding part on the inner surface of the peripheral wall part is located at a position offset from a center in a longitudinal direction of the opening. For this reason, the elastic deformation of the bottom part in the insertion direction is not affected by the holding part when attaching the protective cover to the case. Thereby, the insertion of the storage medium and the attachment of the protective cover can be performed more easily.

According to the embodiment, the engaging part is defined at a tip end of the peripheral wall part adjacent to the opening. The engaging part is engaged with an inner surface portion of the case at the insertion hole in a state where the attachment part is put in the insertion hole.

Accordingly, the engaging part is caught by the peripheral part of the insertion hole along the inner surface of the case by inserting the attachment part into the insertion hole. For this reason, the protective cover can be restricted from dropping if external force such as vibration is added to the protective cover.

The embodiment may be modified as follows.

Figure 12:
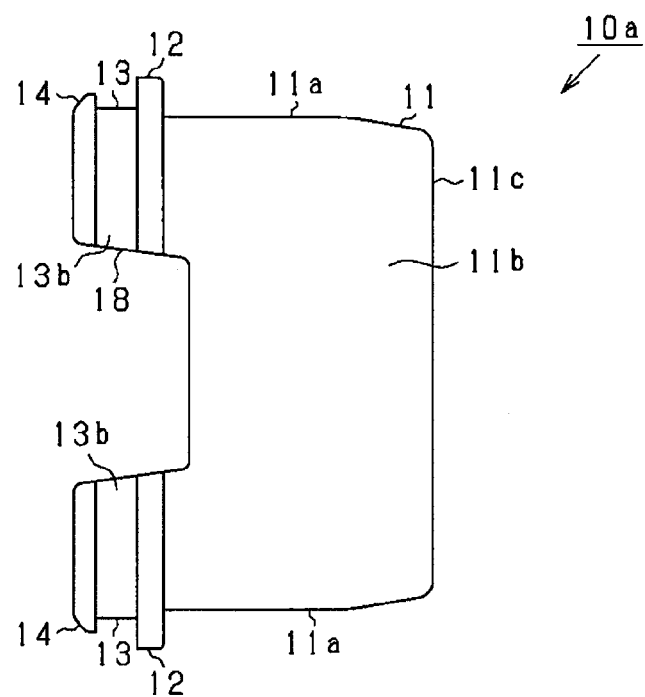
FIG. 12 is a plan view illustrating a protective cover concerning other embodiment.

As shown in FIG. 12, a cutout 18 of a protective cover 10a may be defined from the opening 15 to a position between the flange part 12 and the bottom part 11c, by cutting the flange part 12 toward the bottom part 11c, in the second wall part 11b. In this case, the central portion of the flange part 12 located on the external surface of the second wall part 11b is removed due to the cutout 18. Since a part of the flange part 12 is removed, a portion of the protective cover 10a adjacent to the bottom part 11c can be more easily elastically deformed in the insertion direction. Since the length of the cutout 18 can be increased compared with the cutout 16 of FIG. 1, a portion of the protective cover 10a adjacent to the bottom part 11c can be more easily elastically deformed in the insertion direction. Further, the force required for pushing the protective cover 10a can be made small. Thereby, the insertion of the storage medium CA and the attachment of the protective cover 10a can be performed still more easily. In addition, in FIG. 12, the same mark is attached to the same composition as the composition shown in FIG. 1 for convenience.

The second wall part 11b may have a cutout from the opening 15 to a position not reaching the flange part 12 in the direction toward the bottom part 11c.

Figure 13:
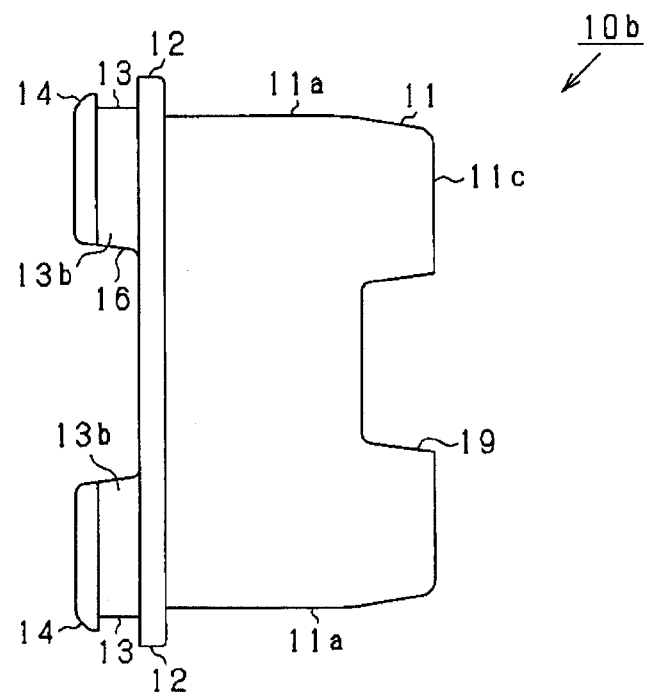
FIG. 13 is a plan view illustrating a protective cover concerning other embodiment.

As shown in FIG. 13, the bottom part 11c of a protective cover 10b may have an opening 19. In this case, a worker can push the end of the storage medium CA directly with a finger, in addition to the bottom part 11c. In addition, in FIG. 13, the same mark is attached to the same composition as the composition shown in FIG. 1 for convenience.

The cutout 16 may be formed in either one of the second wall parts 11b.

The flange part 12 may not be formed in all the circumferences of the peripheral wall part 11. The flange part 12 may be formed in a part of the peripheral wall part 11. The peripheral wall part 11 may not have the flange part 12.

Such changes and modifications are to be understood as being within the scope of the present disclosure as defined by the appended claims.

What is claimed is:

1. A protective cover that protects a protrusion part of a storage medium protruding from an external surface of a case having an insertion hole in which the storage medium is arranged, the protective cover comprising:
   a peripheral wall part made of elastic material;
   a bottom part made of elastic material, wherein a receiving space is defined by the peripheral wall part and the bottom part to receive the protrusion part of the storage medium; and
   a flange part to be in contact with the external surface of the case in a state where the peripheral wall part is attached to the case, wherein
   the peripheral wall part has an opening at an end opposite from the bottom part, the opening being connected with the receiving space, the storage medium being located in the opening,
   the peripheral wall part has an attachment part to be inserted in the insertion hole, the attachment part being a portion of the peripheral wall part and having a predetermined length from the opening toward the bottom part,
   an outer surface of the attachment part is in contact with an inner surface of the insertion hole such that the peripheral wall part is attached to the case,
   the peripheral wall part has a cutout extending from the opening toward the bottom part,
   the attachment part of the peripheral wall part is defined between the opening and the flange part,
   the case includes:
      a control board, and
      a connector arranged on the control board to oppose the insertion hole, the connector electrically connecting the control board to the storage medium,
   the peripheral wall part and the bottom part, which are attached to the case, cover the insertion hole,
   the cutout extends from the opening toward the bottom part, and
   the cutout has a length shorter than or equal to the predetermined length.

2. The protective cover according to claim 1, wherein the flange part is projected outward from the peripheral wall part.

3. The protective cover according to claim 1, wherein the cutout extends from the opening to the flange part.

4. The protective cover according to claim 1, wherein the cutout extends from the opening to a position between the flange part and the bottom part.

5. The protective cover according to claim 1, wherein the cutout is one of a plurality of cutouts defined in the peripheral wall part.

6. The protective cover according to claim 5, wherein the plurality of cutouts is formed at positions opposing to each other in the peripheral wall part.

7. The protective cover according to claim 1, wherein a depth dimension from the opening to the bottom part is set such that a clearance is defined between the storage medium and the bottom part in an insertion direction of the storage medium in a state where the storage medium is received in the receiving space and where the flange part is in contact with the external surface of the case.

8. The protective cover according to claim 1 further comprising:
   a holding part holding an end of the storage medium to determine a position of the storage medium relative to the protective cover, wherein the holding part is defined on an inner surface of the peripheral wall part adjacent to the bottom part.

9. The protective cover according to claim 8, wherein the holding part has a pair of ribs extending from the bottom part toward the opening along the inner surface of the peripheral wall part, and
   the holding part is located at a position offset from a center in a longitudinal direction of the opening.

10. The protective cover according to claim 1, further comprising:
    an engaging part defined at a tip end of the peripheral wall part adjacent to the opening, wherein the engaging part is engaged with an inner surface portion of the case at the insertion hole in a state where the attachment part is located in the insertion hole.

11. The protective cover according to claim 1, wherein the peripheral wall part has a rectangular parallelepiped shape including a pair of first wall parts opposing to each other in a longitudinal direction of the opening, and a pair of second wall parts opposing to each other in a longitudinal direction of the opening, and a pair of second wall parts opposing to each other in a short-side direction of the opening,
    the cutout is defined in each of the second wall parts, and
    the attachment part is defined on both sides of the cutout.

12. The protective cover according to claim 1, wherein the peripheral wall part further has a rib part extending in a direction from the bottom part toward the opening, inside of the peripheral wall part, and
    the rib part has
       a guide part guiding the storage medium, and
       a holding part continuously formed from the guide part to hold an end of the storage medium.

* * * * *